United States Patent [19]

Heinecke et al.

[11] 4,433,012

[45] Feb. 21, 1984

[54] A PROCESS FOR THE PYROLYTIC DEPOSITION OF ALUMINUM FROM TIBA

[75] Inventors: Rudolf A. H. Heinecke, Harlow; Ronald C. Stern, Cheshunt, both of England

[73] Assignee: ITT Industries, Inc., New York, N.Y.

[21] Appl. No.: 324,729

[22] Filed: Nov. 25, 1981

Related U.S. Application Data

[63] Continuation of Ser. No. 168,845, Jul. 10, 1980, abandoned, which is a continuation of Ser. No. 034,067, Apr. 27, 1979, abandoned.

[51] Int. Cl.³ .................. C23C 11/00; C23C 13/00
[52] U.S. Cl. .................. 427/252; 427/39; 427/91; 427/320
[58] Field of Search .......... 427/39, 88, 91, 229, 427/252, 299, 327, 320, 328; 118/715, 719, 725, 733

[56] References Cited

U.S. PATENT DOCUMENTS

| | | | |
|---|---|---|---|
| 2,867,546 | 1/1959 | Mac Nevin | 427/252 |
| 2,921,868 | 1/1960 | Berger | 427/252 |
| 2,929,739 | 3/1960 | Breining et al. | 427/252 |
| 2,990,295 | 6/1961 | Breining et al. | 427/252 |
| 3,041,197 | 6/1962 | Berger | 427/252 |
| 3,158,499 | 11/1964 | Jenkin | 427/229 |
| 3,188,230 | 6/1965 | Bakish et al. | 427/252 |
| 3,282,243 | 11/1966 | Phillips et al. | 427/252 |
| 3,402,067 | 9/1968 | Langley | 427/229 |
| 3,449,824 | 6/1969 | Heilmeier et al. | 427/39 |
| 3,479,219 | 11/1969 | Haines | 427/252 |
| 4,031,274 | 6/1971 | Bessen | 427/229 |

FOREIGN PATENT DOCUMENTS

| | | | |
|---|---|---|---|
| 758258 | 4/1971 | Belgium | 427/252 |
| 1235106 | 2/1967 | Fed. Rep. of Germany | 427/252 |
| 1267054 | 4/1968 | Fed. Rep. of Germany | 427/252 |
| 2309506 | 8/1974 | Fed. Rep. of Germany | 427/91 |
| 49-11540 | 3/1974 | Japan | 427/252 |
| 49-11541 | 3/1974 | Japan | 427/229 |
| 1352619 | 5/1974 | United Kingdom | 427/252 |

OTHER PUBLICATIONS

Pierson, "Aluminum Coatings by the Decomposition of Alkyls", p. 257, Apr. 8, 1977.
Hiler et al., "Development of a Method to Accomplish Aluminum Deposition by Gas Plating", WADC Tech. Report, pp. 13, 20, 24, 25, 6/1/59.

Primary Examiner—S. L. Childs
Attorney, Agent, or Firm—James B. Raden

[57] ABSTRACT

A method for the deposition of aluminum on a solid body of pyrolysis of tri-isobutyl aluminum vapor diluted with an inert carrier gas.

8 Claims, 2 Drawing Figures

A PROCESS FOR THE PYROLYTIC DEPOSITION OF ALUMINUM FROM TIBA

This is a continuation, of application Ser. No. 168,845, filed July 10, 1980 which is a continuation of Application Ser. No. 034,067 filed Apr. 27, 1979, now abandoned.

BACKGROUND OF THE INVENTION

This invention relates to the vapor deposition of metal films and in particular to the thermally induced deposition of aluminum from volatile aluminum compounds and to an apparatus for effecting such deposition.

Many industrial processes, such as the fabrication of semiconductor devices or the construction of capacitors, require the deposition of metal films e.g. to provide electrodes or interconnecting conductor tracks.

Generally such metal films are provided by vacuum evaporation of the metal. This process however, requires very careful control to ensure that a hard vacuum is maintained and that traces of impurities are excluded. Furthermore, vacuum processing requires the provision of relatively expensive airlocks and involves considerable process time. To overcome these difficulties atmospheric pressure processes have been developed in which aluminum is thermally deposited by decomposition of a volatile aluminum compound, generally tri-isobutyl aluminum (TIBA). Such a process, however, has so far proved difficult to control and does not, in general, give reproducible results.

It is thought that many of the problems are caused by partial decomposition of TIBA prior to reaction and, in an attempt to prevent such decomposition, some workers have employed mixtures of TIBA and isobutylene. Such a technique, however, has been found to produce very poor results.

SUMMARY OF THE INVENTION

According to one aspect of the invention there is provided a process for the pyrolytic deposition of aluminum from tri-isobutyl aluminum (TIBA), the process including passing a stream of dry, oxygen free, argon or nitrogen, through a quantity of liquid TIBA maintained at a temperature below 90° C., so as to entrain a proportion of TIBA vapor, feeding the argon in nitrogen with the entrained TIBA to a reaction chamber containing workpieces to be coated in the aluminum, selectively pulsing dry, oxygen free, argon or nitrogen into the reaction chamber so as to provide a substantially uniform TIBA concentration within the vessel, and maintaining the workpieces at a temperature in the range 250°–270° C. thereby causing pyrolytic deposition of aluminum thereon.

According to another aspect of the invention, there is provided an apparatus for the pyrolytic deposition of aluminum from tri-isobutyl aluminum (TIBA) onto a plurality of workpieces, the apparatus including a reaction chamber in which pyrolytic deposition takes place, means for supplying a controlled stream of dry oxygen free argon or nitrogen containing entrained TIBA vapor to the reaction chamber means for supplying pulsed quantities of dry, oxygen free, argon or nitrogen to the reaction chamber so as to provide a substantially uniform constitution of the gas mixture therein, and means for heating workpieces supported in the reaction chamber to a temperature in the range 250°–270° C. so as to induce pyrolytic deposition of aluminum onto the workpieces.

Tri-isobutyl aluminum (TIBA) is known to split at a temperature of around 100° C. into isobutylene and di-isobutyl aluminum hydride, a compound with a relatively low vapor pressure. It is thought that the problems involved in the prior art thermal deposition process, i.e. poor quality films and poor reproducibility are caused by condensation of di-isobutyl aluminum hydride on the inner surfaces and the vapor feed lines of the deposition apparatus. In time this condensate reacts with traces of impurity gases, e.g. water and oxygen. Even though such a layer may be very thin it is thought that its catalytic activity changes part of the TIBA vapors on their way to the deposition reactor resulting in the previously observed inferior film quality.

BRIEF DESCRIPTION OF THE DRAWINGS

An embodiment of the invention will now be described with reference to the accompanying drawing in which.

DETAILED DESCRIPTION OF THE INVENTION

Figure 1:
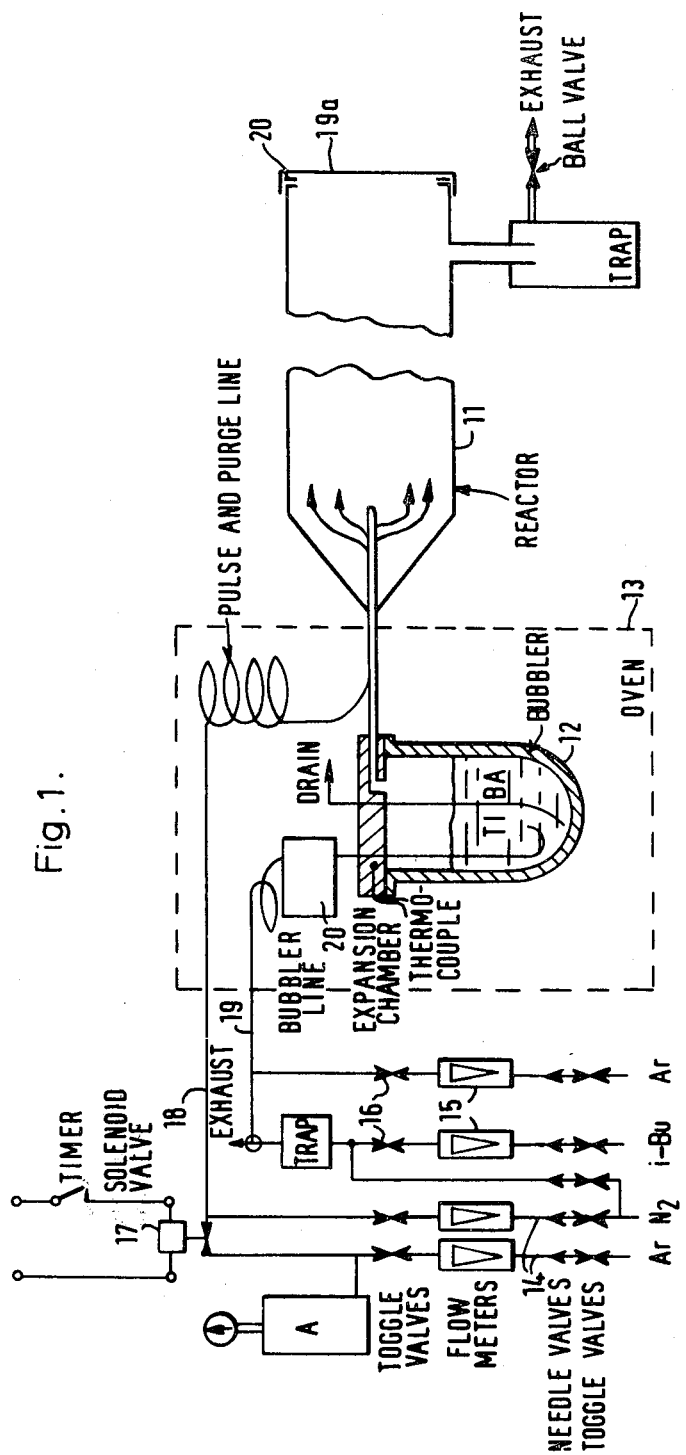
FIG. 1 is a schematic view of an apparatus for the thermal deposition of aluminum.

Referring to the drawing, the apparatus includes a reaction vessel 11 in which pyrolytic deposition of aluminum is effected and which is maintained at a temperature in the range 250°–270° C. by a furnace (not shown). Tri-isobutyl aluminum vapor is carried into the reaction vessel 11 in a steady stream of dry, oxygen free inert carrier gas such as argon or nitrogen which is fed through a bubbler 12 containing liquid TIBA and which is maintained at a temperature of 80°–90° C. by an oven 13.

Figure 2:
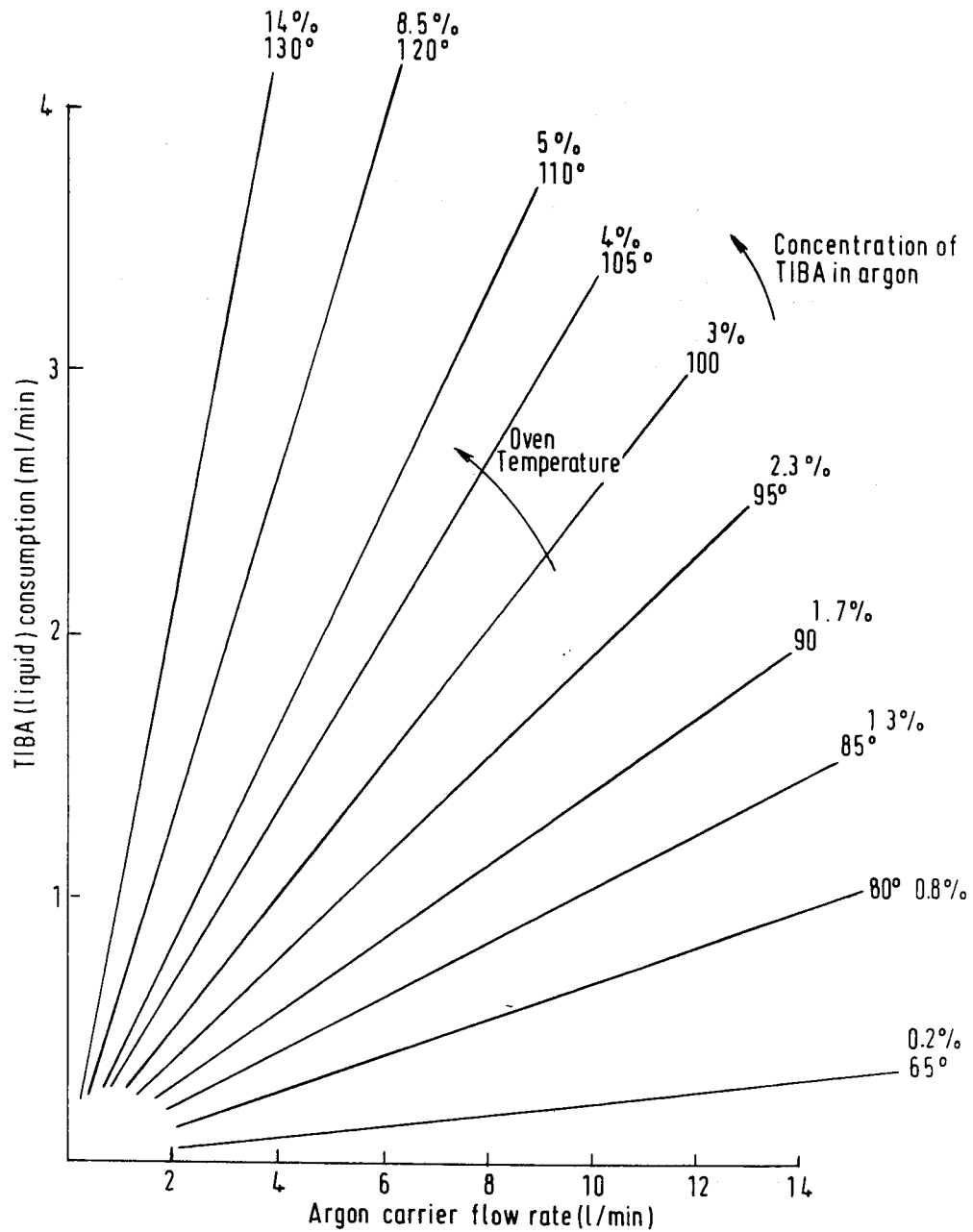
FIG. 2 shows by way of example the relationship between carrier gas flow rate and TIBA consumption in the apparatus of FIG. 1.

Supplies of gases to the apparatus are provided via inlet control valves 14, flowmeters 15 and valves 26. A solenoid operable change-over valve 17 couples selectively via a tube 18 to the reactor 11. Pipe 19 supplies argon to the bubbler 12 via an expansion chamber 20. In order to reduce the rate of conversion of TIBA into DIBAH, which is probably catalyzed by the surfaces of the vapor feed lines of the apparatus, it is necessary to maintain the TIBA vapor temperature below 90° C. and preferably within the range 84° to 86° C. The amount of TIBA fed into the reaction vessel 11 is determined both by the temperature and the flow rate of argon through the bubbler, the relationship being indicated in FIG. 2. In the arrangement described an argon flow rate of 7 liters/min at a TIBA temperature of 85° C. was found to be suitable. It should be noted that the results shown in FIG. 2 are quoted purely by way of example to demonstrate the general relationship between argon flow-rate and TIBA consumption.

Pyrolytic deposition of aluminum on workpieces 13 is effected in the reaction vessel 11 which vessel is maintained at a temperature preferably between 250° and 270° C. We have found that at temperatures below 250° little deposition takes place, while at temperatures above 270° C. the film quality becomes poor.

While not in operation the apparatus is purged with purified nitrogen fed via the tube 18 to the reaction vessel 11. Furthermore, through all periods when the reactor 11 is cold or at a reduced temperature, isobutylene is passed through the bubbler at a rate of about one bubble per second in order to convert any DIBAH contamination in the gas lines back into TIBA.

We have found that this technique of purging the apparatus with isobutylene results in superior quality deposited films. It should be noted that when the apparatus is in use the isobutylene purge is turned off.

For deposition the work pieces 13 are loaded through a door 19 at one end of the reactor 11. The door is closed against gasket 20 and the reactor 11 is purged with nitrogen. After the work pieces have had sufficient time to reach the temperature of the reactor, the nitrogen purge is switched off and argon is supplied to the bubbler so as to introduce TIBA to the reactor 11. Uniform distribution of the gas within the reaction is ensured by supplying periodic pulses of dry, oxygen free argon or nitrogen via the pipe 18 and solenoid valve. The valve may be controlled advantageously by a timer 21, a suitable pulse rate being 1 second on in every 20 seconds. Typical operation conditions are as follows:

Oven temperature 85° C.
Reactor temperature 250°-270° C.
Argon flow rate 7 liters/minute
Argon pulse rate 1 second in 20 seconds.

This results in a deposition rate of the order of 0.1 microns/minute.

The deposition process is terminated by switching off the carrier gas and purging the reactor with purified nitrogen for a further two minutes.

In some applications the quality of the deposited aluminum may be further improved by pretreatment of the workpieces in a hydrogen glow discharge in the presence of certain metals such as gold or nickel. It is observed that the workpiece surface is activated by transport of the metal via the plasma. The thus activated surfaces of the workpieces are then ready for aluminum deposition. The activated surface is stable, and the workpiece may, if necessary, be left in air for several days with little degradation.

While we have described above the principles of our invention in connection with specific apparatus it is to be clearly understood that this description is made only by way of example and not as a limitation to the scope of our invention as set forth in the objects thereof and in the accompanying claims.

We claim:

1. A process for the pyrolytic deposition of aluminum from tri-isobutyl aluminum (TIBA) to form an aluminum film on a work piece, comprising the steps of:

a. purging a reaction chamber with nitrogen prior to initiation of said deposition; and
   b. terminating the nitrogen purge and pyrolytically depositing aluminum on said workpiece, said depositing step comprising:
      (i) passing a stream of dry, oxygen-free inert gas through a quantity of liquid TIBA so as to entrain a portion of TIBA vapor;
      (ii) maintaining the liquid TIBA at a temperature between 80° and 90° C.;
      (iii) directing the inert gas and entrained TIBA to said reaction chamber in which said workpiece is disposed;
      (iv) maintaining a temperature in said reaction chamber within the range between 250° to 270° C. to cause the pyrolytic deposition of aluminum onto a surface of the workpiece; and
      (v) supplying periodic pulses of dry, oxygen free inert gas without entrained TIBA to the reaction chamber during deposition whereby a substantially uniform TIBA concentration is maintained within the chamber and spent reactive gases resulting from the decomposition of TIBA are purged from the chamber.

2. The process according to claim 1, wherein said dry, oxygen-free inert gas is selected from the group including argon and nitrogen.

3. The process according to claim 1, additionally comprising the step of purging the reaction chamber with isobutylene at a given rate when the temperature of said chamber falls below 250° C.

4. The process according to claim 3, wherein the isobutylene is provided at a rate of one bubble per second.

5. The process according to claim 1, wherein the step of supplying periodic pulses of dry, oxygen-free inert gas without entrained TIBA includes the step of operating a solenoid valve to release said inert gas at a given rate.

6. The process according to claim 5, wherein the pulses of dry, oxygen-free inert gas without entrained TIBA are provided at a rate of approximately one one-second pulse during each twenty-second period.

7. The process according to claim 1, wherein the dry, oxygen-free inert gas is bubbled through the liquid TIBA at a rate of about 7 liters per minute.

8. The process according to claim 1, wherein the aluminum is deposited at a rate of approximately 0.1 microns per minute.

* * * * *